(12) United States Patent
Izumi et al.

(10) Patent No.: US 6,242,729 B1
(45) Date of Patent: Jun. 5, 2001

(54) TWO-DIMENSIONAL IMAGE DETECTOR

(75) Inventors: Yoshihiro Izumi, Kashihara; Osamu Teranuma, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/274,316

(22) Filed: Mar. 23, 1999

(30) Foreign Application Priority Data

Mar. 23, 1998 (JP) .................................................. 10-073973

(51) Int. Cl.[7] ................................ H01J 27/00; G01J 1/02
(52) U.S. Cl. ................................... 250/208.1; 250/370.09
(58) Field of Search ........................... 250/208.1, 370.08, 250/370.09; 257/72

(56) References Cited

U.S. PATENT DOCUMENTS

| | | | |
|---|---|---|---|
| 5,420,452 | * | 5/1995 | Tran et al. ............................. 257/248 |
| 5,723,866 | * | 3/1998 | Hamilton, Jr. .................. 250/370.09 |
| 5,818,052 | * | 10/1998 | Elbad ............................... 250/370.09 |
| 6,020,590 | * | 2/2000 | Aggas et al. ..................... 250/370.09 |
| 6,107,618 | * | 8/2000 | Fossum et al. .................... 250/208.1 |

FOREIGN PATENT DOCUMENTS

| | | |
|---|---|---|
| 342098/1994 | 12/1994 | (JP) . |
| 411274453 | * 10/1999 | (JP) .............................. H01I/27/146 |

OTHER PUBLICATIONS

"A New Digital Detector for Projection Radiography," (Denny L. Lee, et al., Proc. SPIE vol. 2432, pp. 237–249, Medical Imaging 1995, May 1995).

"Application of a Si Active–Matrix Technology in a X–Ray Detector Panel," (L.S. Jeromin, et al., SID 97 Digest, May 1997, pp. 91–94).

\* cited by examiner

Primary Examiner—Georgia Epps
Assistant Examiner—Saeed Seyrafi
(74) Attorney, Agent, or Firm—Nixon & Vanderhye P.C.

(57) ABSTRACT

A two-dimensional image detector is provided with an active-matrix substrate, which has lattice-shaped wiring, a plurality of thin-film transistors installed at the respective lattice points of the electrode wiring and a plurality of pixel electrodes, an opposing substrate, which has a semiconductor layer having a photoconductive property, and conductive members for connecting the pixel electrodes and the semiconductor electrode. In the gap between the active-matrix substrate and the opposing substrate, areas having no conductive members are filled with an inactive gas.

20 Claims, 8 Drawing Sheets

TWO-DIMENSIONAL IMAGE DETECTOR

FIELD OF THE INVENTION

The present invention relates to a two-dimensional image detection device which can detect images of radioactive rays such as X rays, visible light rays, infrared rays, etc.

BACKGROUND OF THE INVENTION

Conventionally, with respect to two-dimensional image detectors for detecting images by using radioactive rays, there have been known a radioactive-ray two-dimensional image detector in which semiconductor sensors, each of which generates charges (electron-positive hole) upon sensing X-rays, are arranged in a two-dimensional format and electric switches are respectively attached to these sensors so that the electric switches are successively turned on for each row so as to read out charges of the sensors for each column. Specific structures and principles of such a two-dimensional image detector are described, for example, in documents "D. L. Lee, et al., 'A New Digital Detector for Projection Radiography', SPIE, 2432, pp. 237–249, 1995", and "L. S. Jeromin, et al., 'Application of a-Si Active-Matrix Technology in a X-Ray Detector Panel', SID 97 DIGEST, pp. 91–94, 1997", and Japanese Laid-Open Patent Application No. 342098/1994 (Tokukaihei 6-342098) (Published on Dec. 13, 1994).

The following description will discuss the structure and principle of the above-mentioned conventional radioactive-ray two-dimensional image detector. FIG. 7 is an explanatory drawing that schematically shows the structure of the above-mentioned radioactive-ray two-dimensional image detector. Moreover, FIG. 8 is an explanatory drawing that schematically shows the construction of each pixel of the above-mentioned radioactive-ray two dimensional image detector.

As illustrated in FIG. 7 and FIG. 8, the radioactive-ray two-dimensional image detector is constituted by an active-matrix substrate that is a glass substrate 51 on which XY-matrix electrode wiring (gate electrodes 52 and source electrodes 53), thin-film transistors (TFT) 54, and charge-storage capacitors (Cs) 55, etc. are formed, and a photoconductive film 56, a dielectric layer 57 and upper electrode 58 that are formed virtually on the entire surface of the active-matrix substrate.

The charge-storage capacitor 55 has a construction in which charge-storage capacity electrodes (Cs electrodes) 59 and pixel electrodes 60 connected to the drain electrodes of the TFTs 54 are aligned face to face, with an insulating film 61 located in between.

The photoconductive film 56 is made from a semiconductive member that generates charges (electron-positive hole) upon irradiation by radioactive rays such as X-rays. In accordance with the above-mentioned documents, amorphous selenium (a-Se), which has a high dark resistivity so that it exhibits a superior photoconductive property to X-ray irradiation, is adopted. The photoconductive film 56 is formed by the vacuum deposition method with a thickness of 300 to 600 μm.

Moreover, active-matrix substrates, which are formed during processes in manufacturing liquid crystal displays, can also be adopted as the above-mentioned active-matrix substrate. For example, an active-matrix substrate, used for an active-matrix-type liquid crystal display (AMLCD), has a construction having TFTs, XY-matrix electrodes and electric storage capacitors formed by amorphous silicon (a-Si) and polysilicon (p-Si). Therefore, those active-matrix substrates, which are formed during processes in manufacturing liquid crystal displays, are readily utilized as the active-matrix substrate used for a radioactive-ray two-dimensional image detector with slight designing modifications.

The following description will discuss the operation principle of a radioactive-ray two-dimensional image detector having the above-mentioned structure.

When the photoconductive film 56 such as an a-Se film is irradiated with radioactive rays, charges (electron-positive hole) are generated in the photoconductive film 56. As illustrated in FIGS. 7 and 8, since the photoconductive film 56 and the charge-storage capacitors 55 are electrically connected in series with each other, when a voltage is applied between the upper electrode 58 and the Cs electrode 59, charges (electron-positive hole) generated in the photoconductive film 56 respectively shift toward the positive (+) electrode side and the negative (−) electrode side, with the result that a charge is stored in each charge-storage capacitor 55.

Here, a charge-blocking layer 62 consisting of a thin insulating layer is formed between the photoconductive film 56 and the charge-storage capacitors 55, and this serves as a blocking type photodiode that blocks injection of a charge from one side.

With the above-mentioned function, the charges stored in the charge-storage capacitors 55 can be drawn outside from source electrodes S1, S2, S3, . . . , Sn, by making the TFTs 54 in an open state by using input signals of gate electrodes G1, G2, G3, . . . , Gn. Since the electrode wiring (the gate electrodes 52 and source electrodes 53), the TFTs 54, the charge-storage capacitors 55, etc. are all installed in a XY-matrix format, image information of X-rays can be two-dimensionally obtained by scanning signals inputting to the gate electrodes G1, G2, G3, . . . , Gn in a line sequential manner.

Additionally, in the case when the photoconductive film 56, used in the two-dimensional image detector, exhibits photoconductivity not only to radioactive rays such as X-rays, but also to visible light rays and infrared rays, the two-dimensional image detector also functions as a two-dimensional image detector for detecting images resulting from visible light rays and infrared rays.

The radioactive-ray two-dimensional image detector for detecting images by using radioactive rays is designed to use a-Se as the photoconductive film 56. However, since a-Se has a dispersion-type conductive property to photocurrents which is inherent to the amorphous material, it has a poor response characteristic. Moreover, since a-Se does not have a sufficient sensitivity (S/N ratio) to X-rays, information can not be read until just after the charge-storage capacities 55 have been charged sufficiently through irradiation by X-rays for a long time.

Moreover, in an attempt to prevent a charge from being stored in the charge-storage capacitors 55 due to leakage current and to reduce a leak current (dark current) upon irradiation by X-rays, there is an dielectric layer 57 installed between the photoconductive film (a-Se) 56 and the upper electrode 58. Since a charge remains in this dielectric layer 57, a sequence needs to be added so as to eliminate the residual charge for each frame. The resulting problem is that the two-dimensional image detector is only used for picking up still images.

In order to obtain image data from motion images, it is necessary to use a photoconductive film 56 made from a photoconductive member which is a crystal material and also has a superior sensitivity to X-rays. The improvement of the sensitivity of the photoconductive film 56 allows the charge-storage capacitors 55 to be sufficiently charged even irradiation of X-rays for a short period, thereby eliminating the necessity for applying a high voltage to the photoconductive layer 56 and consequently eliminating the dielectric layer 57. For this reason, it is not necessary to add the sequence for eliminating the residual charge for each frame, and it becomes possible to meet the demands for motion images.

With respect to photoconductive members which have a superior sensitivity to X-rays, CdTe, CdZnTe, etc. have been known. In general, the photoelectric absorption of X-rays is directly proportional to the effective atomic number of an absorbing material raised to 5th power; therefore, for example, supposing that the atomic number of Se is 34 and that the effective atomic number of CdTe is 50, the sensitivity is expected to be improved to approximately 6.9 times. However, when an attempt is made to use CdTe or CdZnTe as the photoconductive film 56 of the radioactive-ray two-dimensional detector instead of a-Se, the following problems are raised.

In the conventional application of a-Se, the vacuum vapor deposition method can be used as the film-forming method, and since the film forming temperature is normal temperature, film formation is easily made on the above-mentioned active-matrix substrate. In contrast, in the case of CdTe and CdZnTe, film-forming methods such as the MBE method and the MOCVD method have been known, and in particular, the MOCVD method is suitable from the viewpoint of film formation to a substrate with a large area.

However, in the case of the film formation of CdTe and CdZnTe by using the MOCVD method, with respect to its materials, organic cadmium (DMCd) has a thermal decomposition temperature of approximately 300° C., and organic telluriums (DETe and DiPTe) have respective thermal decomposition temperatures of approximately 400° C. and 350° C.; therefore, a high temperature approximately 400° C. is required for the film formation.

In general, the above-mentioned TFTs 54, formed on the active-matrix substrate, use an a-Si film and a p-Si film as semiconductor layers. In order to improve the semiconductor characteristics, the a-Si film and the p-Si film are formed while adding hydrogen ($H_2$) at a temperature approximately 300 to 350° C. The TFTs 54 formed in this manner have a heat resistance of approximately 300° C., and when the TFTs 54 are processed at a temperature exceeding this temperature, hydrogen tends to be released from the a-Si film and the p-Si film, thereby causing degradation in the semiconductor characteristics.

Therefore, it has been difficult in practice to form a CdTe film or a CdZnTe film on the active-matrix substrate by using the MOCVD method, from the viewpoint of film-forming temperature.

SUMMARY OF THE INVENTION

The objective of the present invention is to provide a two-dimensional image detector which is assembled by forming a semiconductor layer made of a material such as CdTe and CdZnTe on an active-matrix substrate at a low temperature of not more than 300° C., and which has a superior response characteristic with high reliability and also meets demands for motion pictures.

In order to achieve the above-mentioned objective, the two-dimensional image detector of the present invention is provided with: an active-matrix substrate having a switching element and a charge-storage capacity including a pixel electrode connected to the switching element; an opposing substrate that is provided with an electrode layer and a semiconductor layer having a photoconductivity and that is aligned face to face with the active-matrix substrate with a gap in between; a conductive connecting member for connecting the pixel electrode and the semiconductor layer, that is placed in the gap between the active-matrix substrate and the opposing substrate; and an insulating material that is placed in the gap between the active-matrix substrate and the opposing substrate, at areas having no conductive connecting member.

With the above-mentioned arrangement, the active-matrix substrate having the switching element, the charge-storage capacity including the pixel electrode, etc., and the opposing substrate having the electrode layer and the semiconductor layer are aligned face to face with each other, and between the two substrates, the conductive connecting member connecting the charge-storage capacity and the semiconductor layer is installed. In other words, the semiconductor layer is connected to the charge-storage capacity electrically as well as physically through the conductive connecting member; thus, it is not necessary to directly form the semiconductor layer onto the active-matrix substrate. Therefore, even a semiconductor material that requires a heat treatment at a high temperature exceeding the heat resistance of the switching element during a film-forming process can be used as the above-mentioned semiconductor layer.

Consequently, it is possible to freely select a semiconductor material having a superior sensitivity to light rays including radioactive rays such as X-rays, visible light rays, infrared rays, etc., and to use it as the semiconductor layer, independent of the heat resistance of the switching element.

Moreover, since a semiconductor material having a superior sensitivity is used as the semiconductor layer, it is possible to shorten time required for storing a necessary charge. Therefore, the voltage to be applied to the electrode layer of the opposing substrate can be set lower than that conventionally applied; thus, it is possible to omit a dielectric layer that has been conventionally installed between the semiconductor layer and the electrode layer.

This makes it possible to eliminate the need for adding a sequence for eliminating a residual charge in the dielectric layer for each frame, and consequently to carry out detection for motion images.

Moreover, since the insulating material is installed in an area having no conductive connecting member, the connecting member is not exposed to outer air including moisture, etc. Furthermore, it is possible to reduce electrical crosstalk occurring between the adjacent pixels through the conductive connecting member.

With this arrangement, it is possible to protect the connecting member from moisture and deterioration in the conductivity, etc. with time, and consequently to improve reliability of the two-dimensional image detector.

Moreover, in order to achieve the above-mentioned objective, the two-dimensional image detector of the present invention, which is provided with: an active-matrix substrate having a switching element and a charge-storage capacity including a pixel electrode connected to the switching element; an opposing substrate that is provided with an electrode layer and a semiconductor layer having a photoconductivity and that is aligned face to face with the active-matrix substrate with a gap in between; and a conductive connecting member for connecting the pixel electrode and the semiconductor layer, that is placed in the gap between the active-matrix substrate and the opposing substrate, may be designed so that an area having no conductive connecting member in the gap between the active-matrix substrate and the opposing substrate is depressurized to a reduced pressure lower than the atmospheric pressure.

With the above-mentioned arrangement, by the same effects as obtained in the other arrangement of the present invention, it is possible to freely make a selection among semiconductor materials having a superior sensitivity to light rays including radioactive rays such as X-rays, visible light rays, infrared rays, etc., and to use it as the semiconductor layer, independent of the heat resistance of the switching element. Moreover, it is not necessary to add the sequence for eliminating the residual charge for each frame, and it becomes possible to meet the demands for motion images.

Furthermore, since the area having no conductive connecting member in the gap between the active-matrix substrate and the opposing substrate is depressurized to a reduced pressure lower than the atmospheric pressure, the connecting member can be completely shielded from the air.

Thus, it becomes possible to protect the connecting member and deterioration in the conductivity, etc. with time, and consequently to improve reliability of the two-dimensional image detector.

Moreover, since the pressure in the gap between the two substrates is made lower than the atmospheric pressure, the two substrates are respectively pressed by the atmospheric pressure in the press-joining direction from outside.

This makes it possible to improve the mechanical joining strength between the two substrates.

Moreover, in the area having a reduced pressure lower than the atmospheric pressure, the density of the gas becomes smaller, with the result that the gas is less susceptible to volume variations (expansion and contraction) upon temperature fluctuations.

Consequently, it is possible to maintain a firm mechanical joining strength between the two substrates independent of fluctuations in ambient temperature.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 1:
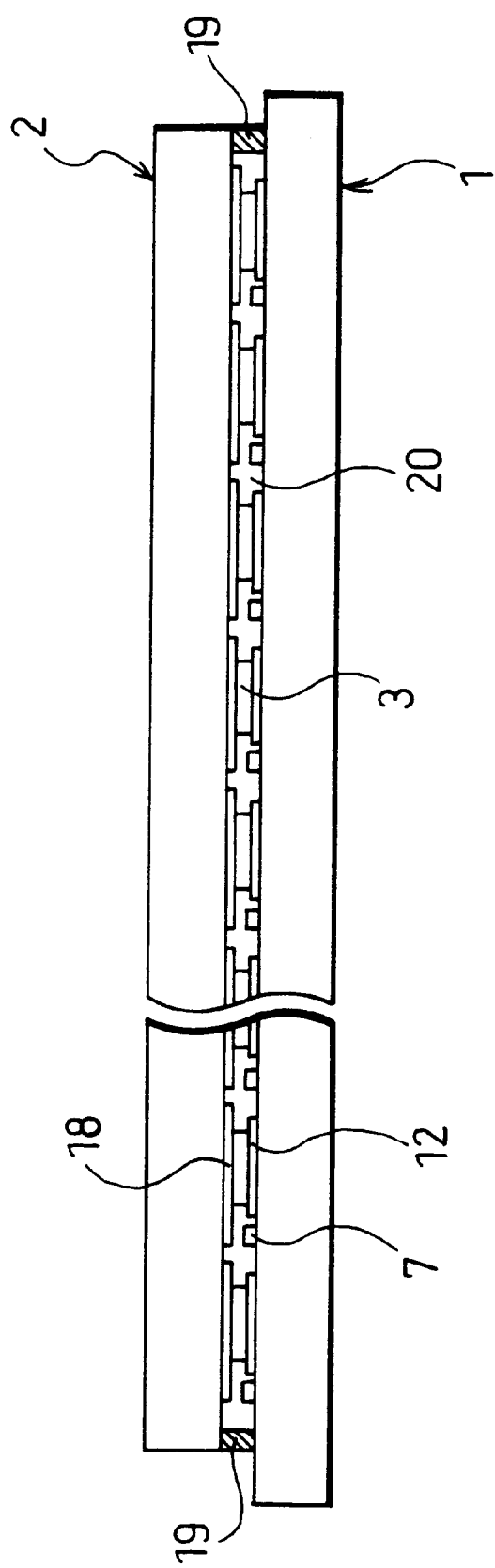
FIG. 1 is a cross-sectional view that shows the entire basic structure of a two-dimensional image detector in accordance with embodiment 1 of the present invention.
Figure 2:
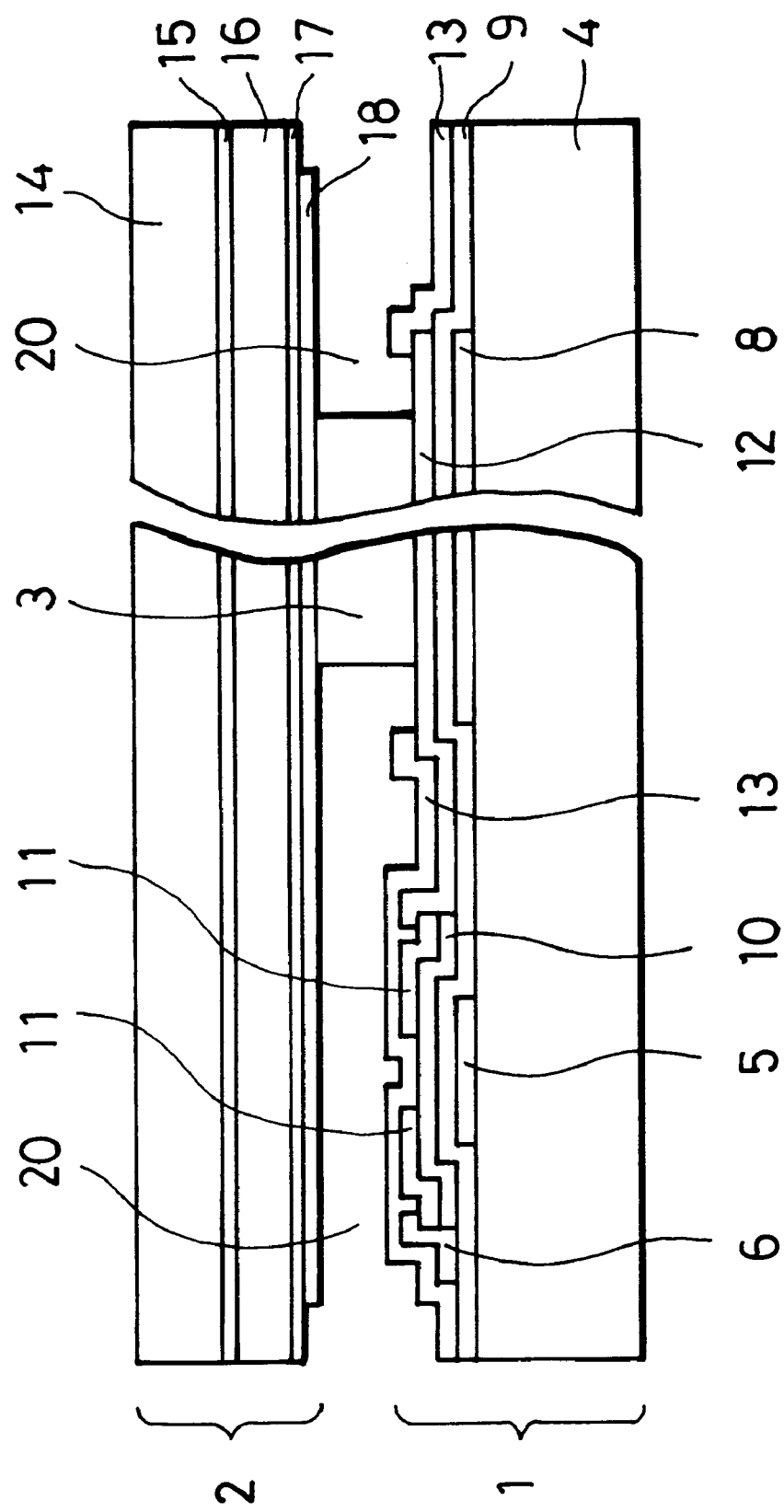
FIG. 2 is a cross-sectional view that shows the basic construction of each pixel of the two-dimensional image detector.
Figure 3:
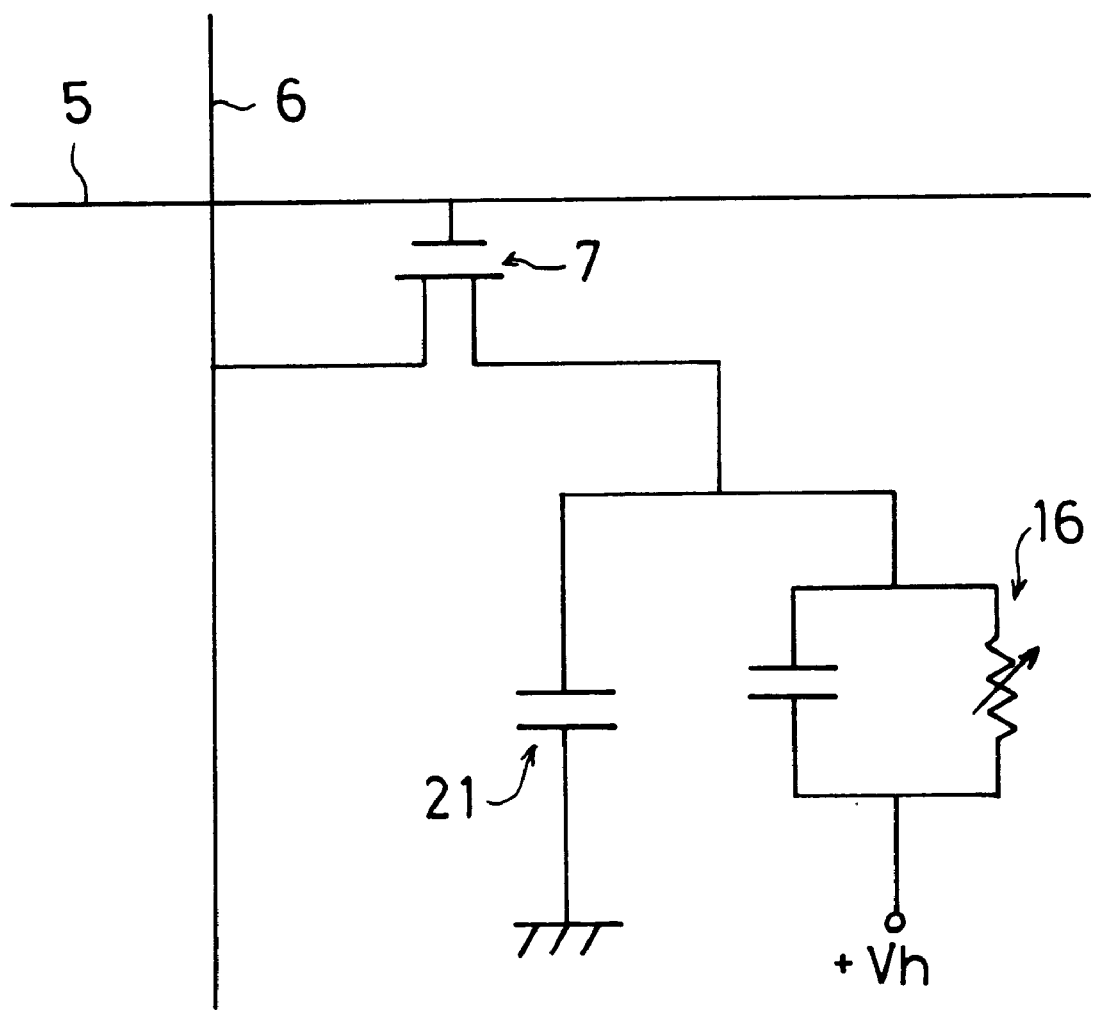
FIG. 3 is an equivalent circuit diagram of each pixel of the two-dimensional image detector.

Referring to FIGS. 1 through 3, the following description will discuss embodiment 1 of the present invention.

FIG. 1 is a cross-sectional view that shows the entire basic structure of a two-dimensional image detector in accordance with the present embodiment. FIG. 2 is a cross-sectional view that shows the basic construction of each pixel of the two-dimensional image detector in detail. As illustrated in the Figures, in the two-dimensional image detector of the present embodiment, an active-matrix substrate 1 and an opposing substrate 2 are aligned face to face with each other, with a conductive member (a connecting member) 3 interpolated in between.

The active-matrix substrate 1 can be formed by means of the same processes as an active-matrix substrate that is formed in processes in manufacturing a liquid crystal display. More specifically, the active-matrix substrate 1 is constituted by electrode wiring having an XY-matrix form (a gate electrode 5 and a source electrode 6), thin-film transistors (hereinafter, referred to as TFTs) 7 and charge-storage capacitors (Cs) consisting of charge-storage capacitor electrodes (hereinafter, referred to as Cs electrodes) 8, pixel electrodes 12, etc., which are all formed on a glass substrate 1.

With respect to the glass substrate 4, a non-alkali glass substrate (for example, #7059 and #1737 made by Corning Inc.) is used, and on this is formed the gate electrode 5 made of a metal film such as Ta. The gate electrode 5 is obtained by forming Ta, etc. into a film having a thickness of approximately 3000 Å by sputtering deposition and patterning it into a desired shape. At this time, the Cs electrodes 8 are also formed.

Next, an insulating film 9, made of a material such as SiNx and SiOx, is formed by the CVD method as a film having a thickness of approximately 3500 Å. The insulating film 9 serves as a gate insulating film for the TFTs 7, and also serves as a dielectric layer between the electrodes (Cs electrodes 8 and pixel electrodes 12) of the charge-storage capacitor (Cs). Here, with respect to the insulating film 9, not only SiNx and SiOx, but also an anode oxidization film obtained by anode-oxidizing the gate electrodes 5 and Cs electrodes 8 may be used in a combined manner.

Next, an a-Si film (i layer) 10, which is to form a channel section of the TFTs 7, and an a-Si film ($n^+$layer) 11, which allows the source and drain electrodes to contact each other, are formed by the CVD method as films having respective thicknesses of approximately 1000 Å and 400 Å, and then patterned into desired shapes.

Successively, the source electrodes 6 and drain electrodes (which also serve as pixel electrodes 12), made of a metal film such as Ta and Al, are formed. The above-mentioned source electrodes 6 and the pixel electrodes 12 are obtained by forming the above-mentioned metal film by the sputtering deposition into films having a thickness of approximately 3000 Å, and then patterning them into desired shapes. Here, the drain electrodes may be formed separately from the pixel electrodes 12, and a transparent electrode such as ITO may be used as the pixel electrodes 12.

Thereafter, an insulating protective film 13 is formed in order to insulate and protect areas other than the aperture sections of the pixel electrodes 12. The insulating film 13 is obtained by forming an insulating film made of a material such as SiNx and Siox by the CVD method as a film having a thickness of approximately 6000 Å, and then patterning it into a desired shape. Besides an insulating film made of an inorganic material, it is possible to use an insulating film made of an organic material such as acryl and polyimide. In this manner, the active-matrix substrate 1 is provided.

In the present embodiment, the TFTs 7 having the reverse-stagger construction using a-Si are used as the switching elements of the active-matrix substrate 1; however, the present invention is not intended to be limited by this construction, and p-Si may be used, or the stagger construction may be adopted.

Here, the op posing substrate 2 is provided with a substrate having a transmitting property to radioactive rays such as X-rays and visible light rays as its supporting substrate 14. A glass substrate having a thickness of 0.7 mm to 1.1 mm is used as the supporting substrate 14.

First, upper electrodes 15 are formed on the virtually entire surface of one side of the supporting substrate 14 by using a conductive film such as Ti, Au and ITO. Here, in the case when this is used as a two-dimensional image detector for detecting images by using visible light rays, ITO electrodes having a transmitting property to visible light rays need to be used as the supporting substrate 14.

Next, on these upper electrodes 15 is formed a semiconductor layer 16 made of CdTe, CdZnTe, etc., by the MOCVD method with a thickness of approximately 0.3 mm to 0.5 mm. The MOCVD method is suitable for film formation onto a large-area substrate; and this method forms a polycrystal film at a temperature ranging from 400 to 500° C. by using materials, such as organic cadmium (dimethylcadmium [DMCd]), organic tellurium (diethyltellurium [DETe] and diisopropyltellurium [DiPTe]), organic zinc (diethylzinc [DEZn], diisopropylzinc [DiPZn] and dimethylzinc [DMZn]).

Moreover, over the virtually entire surface of the semiconductor layer 16 is formed a charge-blocking layer 17 made of a thin insulating layer of AlOx. Then, a conductive film, made of Ta, Al or ITO, etc., is formed with a thickness of approximately 200 Å, and patterned into a desired shape, thereby forming connecting electrodes 18. The connecting electrodes 18 are formed at positions corresponding to the pixel electrodes 12 formed on the active matrix substrate 1. In this manner, each connecting electrode 18 is independently placed for each pixel so that the pixels formed on the semiconductor layer 16 of the opposing substrate 2 are electrically separated from each other. Therefore, a charge, which has been generated inside the semiconductor layer 16 upon incident of radioactive rays and/or light rays, is picked up only by the connecting electrode 18 corresponding to the incident position without being allowed to reach the adjacent pixels, thereby making it possible to reduce electrical crosstalk.

Additionally, as for the opposing substrate 2, the semiconductor layer 16 having a photoconductive property to X-rays may be provided as a semiconductor substrate (a photoconductive substrate) so as to also serve as the supporting substrate. For example, a crystal substrate (having a thickness of 0.3 mm to 0.5 mm) made from a chemical compound semiconductor, such as CdTe and CdZnTe, may be used as the semiconductor substrate. Chemical compound semiconductors of this type may be readily formed into a crystal substrate by means of a method, such as a Bridgeman method, a gradient freeze method and a travel heating method. In this case, over the virtually entire surface of one side of the semiconductor substrate is formed upper electrodes 15 by using a conductive film such as Al and ITO that easily transmits X-rays. Moreover, with respect to the other side, an insulating layer (charge-blocking layer 17), made from AlOx having a thickness of approximately 1000 Å, is formed over the virtually entire surface thereof, and a conductive film, made from Ta, Al, ITO, etc., is formed by sputtering deposition with a thickness of approximately 2000 Å, and then patterned into a desired shape; thus, connecting electrodes 18 are formed.

Next, a photosensitive resin having conductive and adhesive properties is applied or press-bonded onto one of the two substrate formed in the above-mentioned process (that is, the active-matrix substrate 1 side in the present embodiment) as a conductive material 3, and the photosensitive resin is patterned into a desired shape by photolithography process. Then, the two substrates are joined and press-bonded so that the pixel electrodes 12 and the connecting electrodes 18 are allowed to face each other; thus, the two substrates are connected to each other electrically as well as physically so as to form a panel. With respect to the conductive material 3 (photosensitive resin having conductive and bonding properties), those materials obtained by dispersing conductive particles, such as carbon, ITO and metal, into photosensitive resins are preferably used.

Moreover, at this time, a seal member 19 is formed so as to seal the peripheral portion of the joining area between the active-matrix substrate 1 and the opposing substrate 2. Here, a plurality of opening sections are provided in one portion of the seal member 19 so as to make the panel gap (the gap between the joined two substrates) filled with inactive gas 20 in a successive process. Various sealing materials, such as photosetting adhesives, thermosetting adhesives, thermoplastic adhesives and silicone rubber, may be used as the seal member 19.

Thereafter, among areas surrounded by the active-matrix substrate 1, the opposing substrate 2 and the seal member 19, the space having no conductive material 3 is filled with the inactive gas 20. More specifically, gas existing in the panel gap is discharged from one of the opening sections of the seal member 19 and the inactive gas 20 is charged through the other opening section. Upon completion of the filling of the inactive gas 20, the opening sections of the seal member 19 are sealed. Rare gases (argon gas, helium gas, etc.) and gases that are less active (such as nitrogen gas, etc.) are preferably used as the inactive gas 20.

The basic structure of the two-dimensional image detector of the present embodiment as shown in FIGS. 1 and 2 is completed through the above-mentioned processes.

FIG. 3 is an equivalent circuit diagram of each pixel of the two-dimensional image detector. Referring to FIG. 2 and FIG. 3, the following description will discuss the operation principle of the two-dimensional image detector.

First, upon incident of X-rays on the semiconductor layer 16 made from a material such as CdTe and CdZnTe, charges (electron-positive hole) are generated in the semiconductor layer 16 by the photoconductive effect. In this case, the charge-storage capacitors (Cs) 21 and the semiconductor layer 16 are connected in series with each other through the pixel electrodes 12, the conductive material 3 and the connecting electrodes 18. Therefore, when a voltage is applied between the upper electrodes 15 and the Cs electrodes 8, the charges (electron-positive hole) generated in the semiconductor layer 16 respectively shift toward the positive (+) electrode side and the negative (−) electrode side, with the result that a charge is stored in each charge-storage capacitor (Cs) 21.

Here, a charge-blocking layer 17 consisting of a thin insulating layer is formed between the semiconductor layer 16 and the connecting electrodes 18, and this serves as a blocking type photodiode of an MIS (Metal-Insulator-Semiconductor) construction that blocks injection of a charge from one side. This makes it possible to reduce dark currents exerted when there are no incident X-rays. In other words, when a positive voltage is applied to the upper electrode 15 side, the charge-blocking layer 17 serves so as to block electrons from being injected from the connecting electrodes 18 to the semiconductor layer 16.

Moreover, an insulating layer may be interpolated between the semiconductor layer 16 and the upper electrodes 15 so as to block positive holes from being injected from the upper electrodes 15 to the semiconductor layer 16; thus, it is possible to further reduce dark currents.

Here, with respect to the construction of the blocking-type photodiode, namely, the construction of the charge-blocking layer 17, it is of course possible to use the PIN-junction construction, the hetero-junction construction and the Schottky-junction construction, in addition to the MIS construction.

Figure 7:
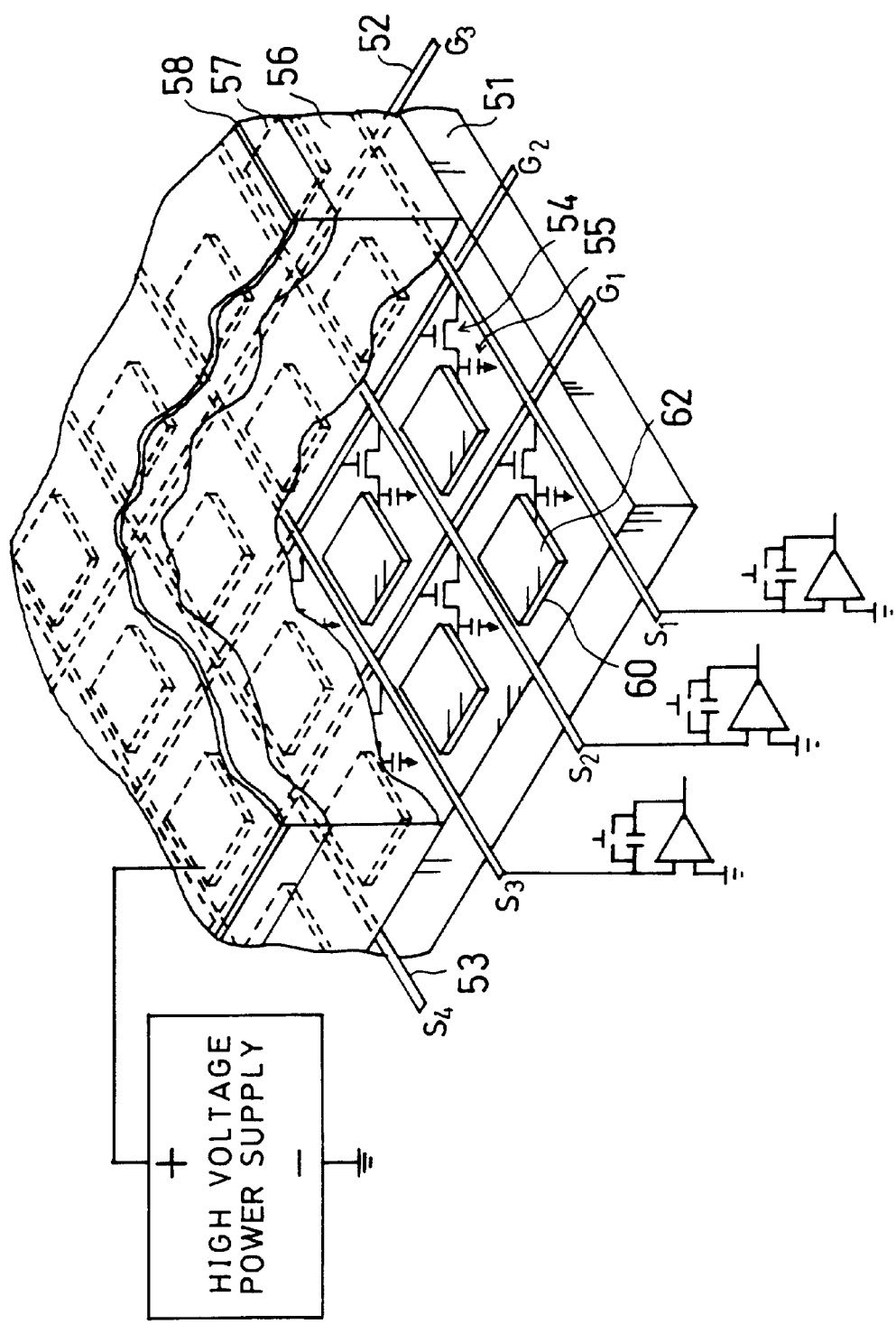
FIG. 7 is an explanatory drawing that shows the entire basic structure of a conventional two-dimensional image detector.
Figure 8:
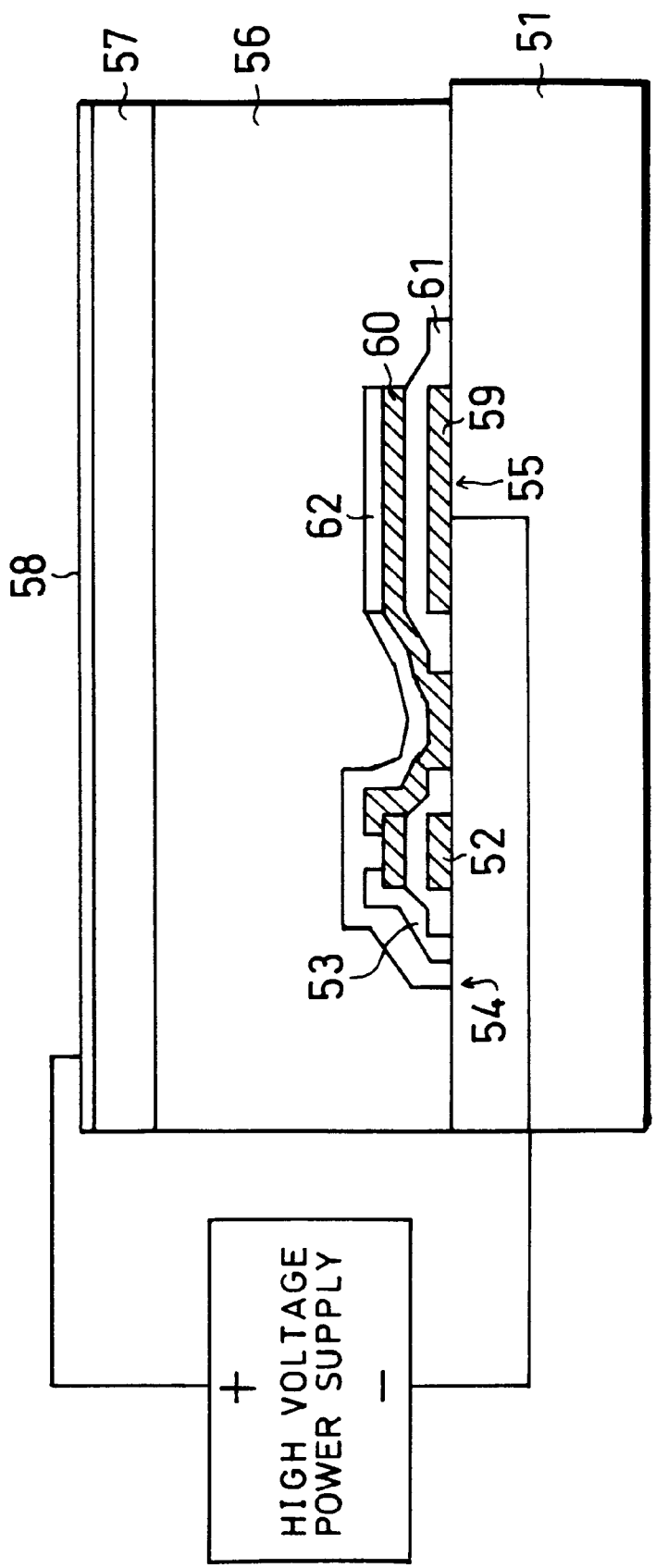
FIG. 8 is an explanatory drawing that shows the basic construction of each pixel in the conventional two-dimensional image detector.

With the above-mentioned function, the charges stored in the charge-storage capacitors (Cs) 21 can be drawn outside from the source electrodes 6 by making the TFTs 7 in an open state by using input signals of the gate electrodes 5. Since the electrode wiring (the gate electrodes 5 and source electrodes 6), the TFTs 7, the charge-storage capacitors (Cs) 21, etc. are all installed in a XY-matrix format as shown in FIG. 7 that depicts a conventional construction, image information of X-rays can be two-dimensionally obtained by scanning signals inputting to the gate electrodes G1, G2, G3, . . . , Gn in a line sequential manner. As described above, the basic operation principle of the present embodiment is the same as that of the two-dimensional image detector shown as the prior art.

Moreover, since the opposing electrodes 2 provided with the semiconductor layer 16 and the active-matrix substrate 1 are formed in a separate manner, materials such as CdTe and CdZnTe, which have a high sensitivity to radioactive rays such as X-rays, may be used as the semiconductor layer 16. Therefore, as compared with conventional two-dimensional image detectors using a-Se, it is possible to improve the sensitivity to X-rays. This allows the charge-storage capacitors (Cs) to be sufficiently charged even irradiation with X-rays for a short time, thereby eliminating the necessity of applying a high voltage thereto and consequently eliminating a dielectric layer. For this reason, it is not necessary to add a sequence for eliminating a residual charge in the dielectric layer for each frame. Thus, it becomes possible to obtain image data that meet the demands for motion images, that is, to obtain image data at a rate of 33 msec/frame.

As described above, the two-dimensional image detector of the present invention has a construction in which the active-matrix substrate 1 and the opposing substrate 2 are connected by the conductive material 3 physically as well as electrically in a flattened manner. Moreover, among areas in the gap between the active-matrix substrate 1 and the opposing substrate 2, the area other than the areas having the conductive material 3 is filled with inactive gas 20 as an insulating material.

Therefore, conventionally, even those semiconductor materials (such as CdTe and CdZnTe) which have not been directly formed on the active-matrix substrate as a film due to problems derived from the relationship between the film-forming temperature of the semiconductor and the heat resistance of the active-matrix substrate may be utilized in the two-dimensional image detector.

Furthermore, in the embodiment of the present invention, among areas in the gap between the active-matrix substrate 1 and the opposing substrate 2, the area other than the areas having the conductive material 3 is filled with inactive gas 20 as an insulating material; therefore, it is possible to prevent the conductive material 3 from exposing to outer air. Consequently, it is possible to protect the conductive material 3 from moisture and deterioration in the adhesive property, conductivity, etc. with time.

In general, when resin absorbs moisture in the air or is exposed to active ions being suspended in the air, its properties tend to deteriorate with time. More specifically, when a photosensitive resin is used as the conductive material 3 that is formed in the gap between the two substrates, the conductive material 3 is susceptible to phenomena such as degradation in the conductive property and the adhesive property. These phenomena are likely to occur on the periphery of the panel that tends to be exposed to air and has a joining portion of the two substrates.

Here, since the peripheral area of the conductive material 3 is filled with a dried inactive gas 20, it becomes possible to eliminate the above-mentioned deterioration of the conductive material 3 with time. In other words, it is possible to improve reliability of the conductive material 3. Of course, the contact between the conductive material 3 and the air can be prevented by installing the seal member 19 alone, and the corresponding effects can be expected. However, gas is trapped and exists between the two substrates; therefore, it is more preferable to replace this gas with the above-mentioned inactive gas 20 so as to more positively prevent the contact between the conductive material 3 and the air. Thus, it becomes possible to further improve reliability of the conductive material 3.

In the present embodiment, nitrogen gas or argon gas was used as the inactive gas 20, and the two gases did not cause any deterioration of the conductive material 3 even after environmental aging tests with high temperature and high humidity. The inactive gas 20 is, of course, not intended to be limited to this, and rare gases, such as helium gas, and other comparatively inactive gases may be used, with the same effects on principle. Moreover, since the filling inactive gas 20 serves as an insulating material, it can reduce crosstalk occurring between the adjacent pixels through the conductive material 3.

Embodiment 2

Figure 4:
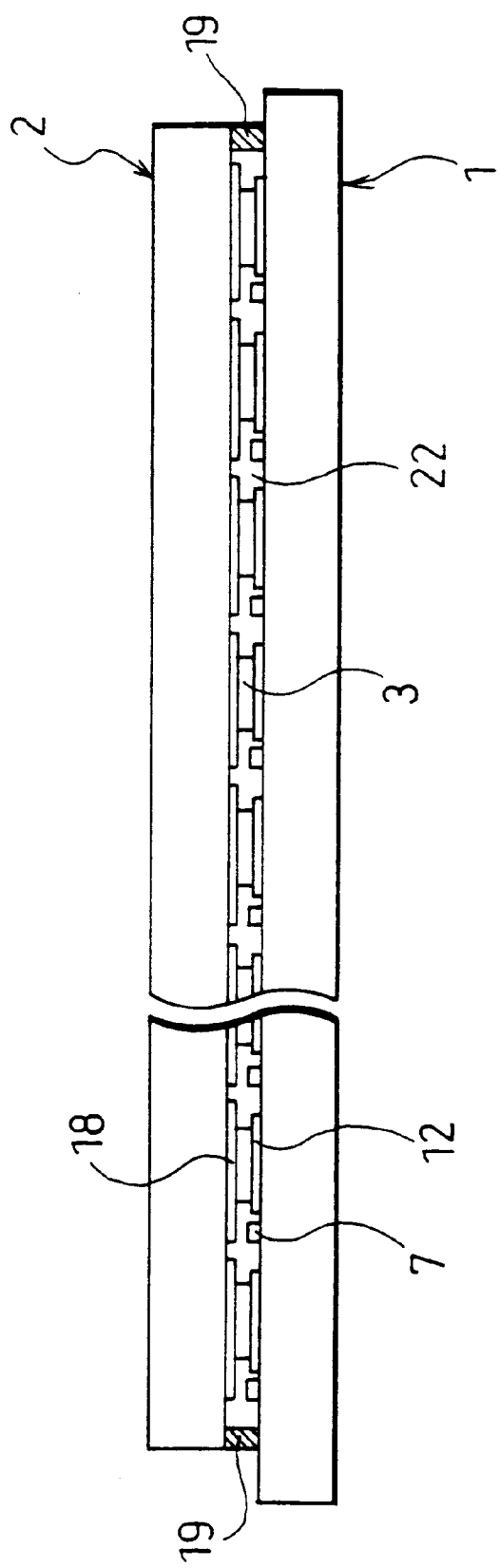
FIG. 4 is a cross-sectional view that shows the entire basic structure of a two-dimensional image detector in accordance with embodiment 2 of the present invention.

Referring to FIG. 4, the following description will discuss embodiment 2 of the present invention. Here, in the present embodiment, those members that have the same functions and that are described in embodiment 1 are indicated by the same reference numerals and the description thereof is omitted.

The above-mentioned embodiment 1 discussed a case in which, in the gap between the active-matrix substrate 1 and the opposing substrate 2, areas other than the area having the conductive material 3 is filled with inactive gas 20 so that the reliability of the conductive material 3 is enhanced. Here, the present embodiment indicates a case in which inactive liquid is injected therein instead of the inactive gas 20, with the same effect.

FIG. 4 is a cross-sectional view that shows the basic construction of a two-dimensional image detector in which the gap between the active-matrix substrate 1 and the opposing substrate 2 is filled with silicone oil 22 as an insulating material. The two-dimensional image detector of the present embodiment has the same construction as the two-dimensional image detector of embodiment 1, except that the substance injected between the two substrates is different.

Among various types of silicones, the above-mentioned silicone oil 22 indicates those that have a small degree of polymerization so that it is in a liquid state at room temperature, and that are chemically inactive with superior electrical insulating and anti-aging properties. Those silicons are substances in which their molecular structure consists of siloxane bonds (—Si—O—), with the silicon atom further having side chains constituted by bonded alkyl groups, aryl groups or derivative groups of these.

As described above, since the areas other than the area having the conductive material 3 are filled with the silicone oil 22 as an insulating material, it is possible to completely shield the conductive material 3 from the air, and consequently to improve the reliability of the conductive material 3 in the same manner as the inactive gas 20 used in embodiment 1. Here, the inactive liquid is not intended to be limited to silicone oil, and any comparatively inactive liquid may be used with an expectation of the same effect on principle.

Embodiment 3

Figure 5:
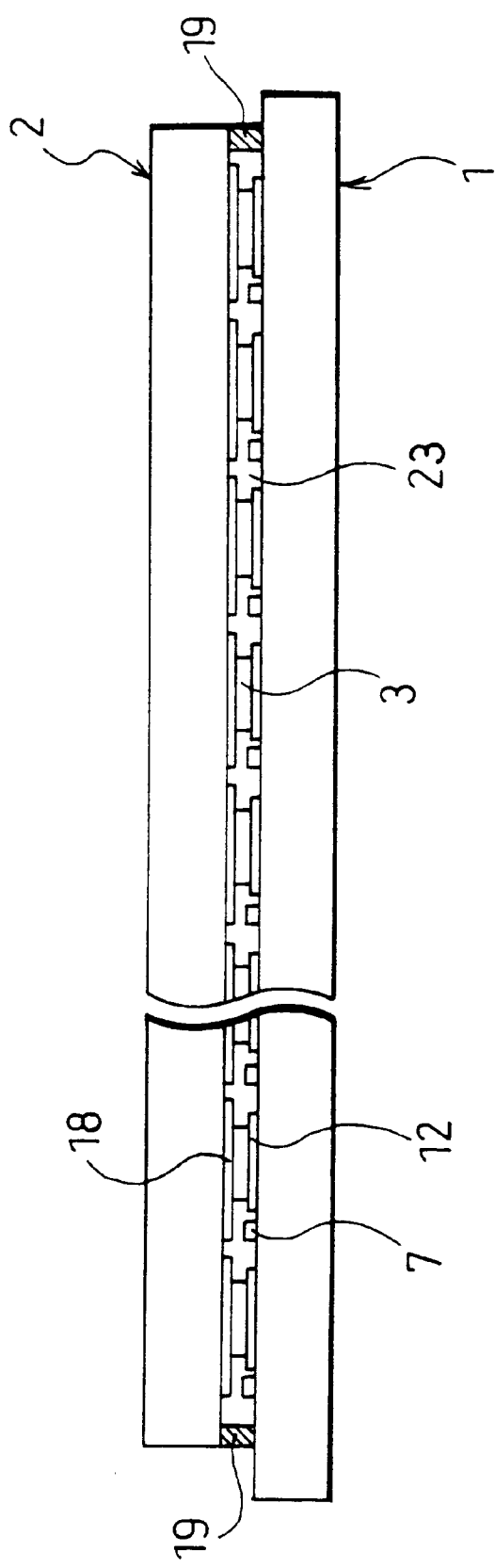
FIG. 5 is a cross-sectional view that shows the entire basic structure of a two-dimensional image detector in accordance with embodiment 3 of the present invention.

Referring to FIG. 5, the following description will discuss embodiment 3 of the present invention. Here, in the present embodiment, those members that have the same functions and that are described in embodiment 1 are indicated by the same reference numerals and the description thereof is omitted.

The above-mentioned embodiment 1 discussed a case in which the reliability of the conductive material 3 is enhanced by injecting inactive gas 20 as an insulating material into the areas other than the area having the conductive material 3 in the gap between the active-matrix substrate 1 and the opposing substrate 2. Here, in the present embodiment, instead of the inactive gas 20, a photopolymerizable high polymer 23 is injected between the gap between the active-matrix substrate 1 and the opposing substrate 2 so as to improve the reliability of the conductive material 3 and to obtain new effects.

FIG. 5 is a cross-sectional view showing the basic construction of a two-dimensional image detector in which the gap between the two substrates (the active matrix substrate 1 and the opposing substrate 2) is filled with the photopolymerizable high polymer 23.

The above-mentioned photopolymerizable high polymer 23 has a double-bonded portion of acrylic series or ene/thiol, etc., and upon irradiation with light the double bond is broken to accelerate the polymerization; this is widely used in general as a photosetting resin (adhesive agent).

With respect to the injection method of the photopolymerizable high polymer 23, a photopolymerizable high polymer material with a low viscosity is first injected into the gap between the two substrates. Then, light is projected on the active-matrix substrate 1 side, thereby accelerating the polymerization of the photopolymerizable high polymer material.

As described above, since the photopolymerizable high polymer 23 is injected into the areas other than the area having the conductive material 3 in the gap between the active-matrix substrate 1 and the opposing substrate 2, it is possible to completely shield the conductive material 3 from the air. Therefore, it becomes possible to improve the reliability of the conductive material 3 in the same manner as the case using the inactive gas 20 as shown in embodiment 1. Moreover, the photopolymerizable high polymer 23 also serves as a bonding agent between the two substrates, thereby increasing the mechanical bonding strength of the two substrates; thus, this arrangement is particularly effective for cases in which the conductive material 3 itself has only a weak bonding strength.

Additionally, in the case when, upon projecting light from the active-matrix substrate 1 side during the production process, the photopolymerizable high polymer material does not undergo photopolymerization at areas shielded from light by the metal wiring (electrode wiring), etc. that is installed on the active-matrix substrate 1, a material also having a thermopolymerizable property is preliminarily used as the photopolymerizalbe high polymer material, and after having been irradiated with light, this is subjected to a heating treatment; thus, it becomes possible to allow even the area having no irradiation with light to completely undergo polymerization.

Embodiment 4

Figure 6:
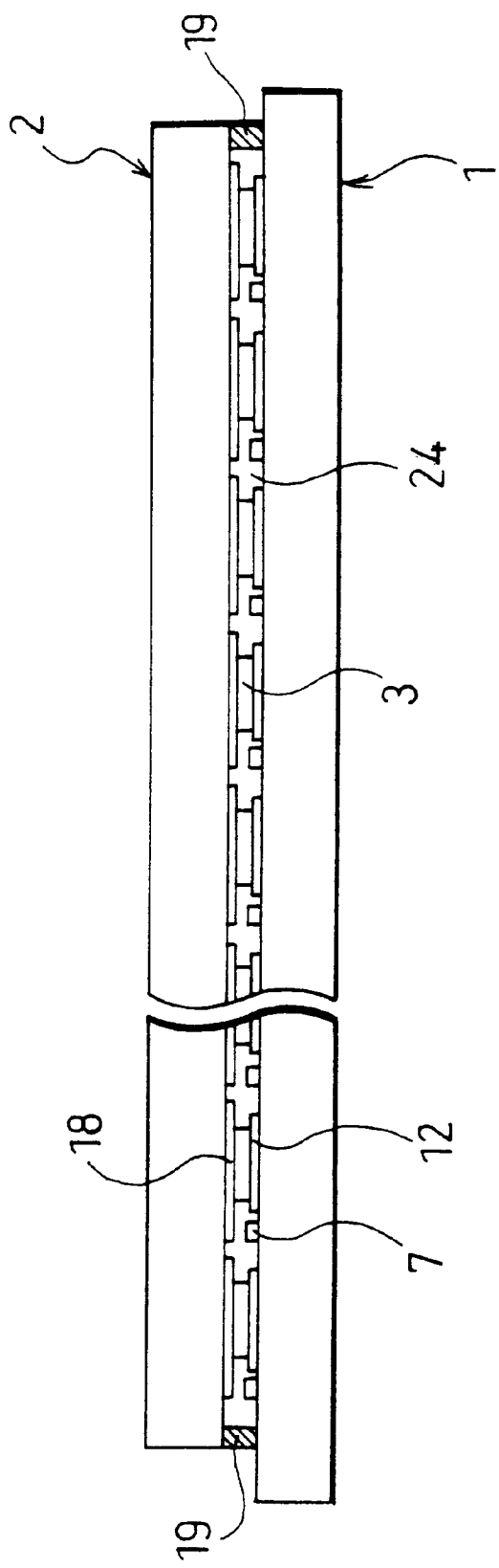
FIG. 6 is a cross-sectional view that shows the entire basic structure of a two-dimensional image detector in accordance with embodiment 4 of the present invention.

Referring to FIG. 6, the following description will discuss embodiment 4 of the present invention. Here, in the present embodiment, those members that have the same functions and that are described in embodiment 1 are indicated by the same reference numerals and the description thereof is omitted.

The above-mentioned embodiment 1 discussed a case in which the reliability of the conductive material 3 is enhanced by injecting inactive gas 20 as an insulating material into the areas other than the area having the conductive material 3 in the gap between the active-matrix substrate 1 and the opposing substrate 2. Here, in a two-dimensional image detector of the present embodiment, instead of injecting the inactive gas 20, the corresponding areas are depressurized lower than the atmospheric pressure so as to form depressurized areas 24; consequently, it becomes possible to obtain the same effects.

FIG. 6 is a cross-sectional view showing the basic construction of a two-dimensional image detector in which areas other than the area having the conductive material 3 in the gap between the two substrates (the active matrix substrate 1 and the opposing substrate 2) are depressurized to approximately $1/10$, of the atmospheric pressure so as to form the depressurized areas 24. The two-dimensional image detector of the present embodiment has the same construction as that of embodiment 1, except for the above-mentioned depressurized areas 24.

As described above, since the areas other than the area having the conductive material 3 in the gap between the two substrates are formed into the depressurized areas 24, it is possible to completely shield the conductive material 3 from the air. Therefore, it becomes possible to improve the reliability of the conductive material 3 in the same manner as the case using the inactive gas 20 as shown in embodiment 1.

Moreover, the existence of the depressurized areas 24 in the gap between the two substrates allows the gap between the two substrates to be pressed by the atmospheric pressure from the outside of the two substrates, thereby increasing the mechanical bonding strength of the two substrates; thus, this arrangement is particularly effective for cases in which the conductive material 3 itself has only a weak bonding strength.

Furthermore, since the density of the gas is small in the above-mentioned depressurized areas 24, no volume fluctuation (expansion and contraction) occurs in the gas against fluctuations in temperature, thereby making it possible to increase the mechanical bonding strength under environmental temperature fluctuations.

Additionally, the above-mentioned embodiments 1 through 4 dealt with two-dimensional image detectors mainly used for X-rays; however, in the case when semiconductors (photoconductive bodies) that are to be used exhibit a photoconductive property not only to radioactive rays such as X-rays, but also to visible light rays and infrared rays, the detector may also be used as a two-dimensional image detector capable of detecting images by using visible light rays and infrared rays. In this case, with respect to the upper electrode material placed on the light-incident side when viewed from the semiconductors (photoconductive bodies), it is necessary to use a transparent electrode material such as ITO that transmits visible light rays and infrared rays. Moreover, the thickness of the semiconductors (photoconductive bodies) also need to be optimized depending on the absorption efficiencies of visible light rays and infrared rays.

As described above, the two-dimensional image detector of the present invention has a construction in which an active-matrix substrate, which has lattice-shaped wiring (gate electrodes and source electrodes), a plurality of thin-film transistors (TFTs) installed at the respective lattice points of the electrode wiring and a plurality of pixel electrodes, and an opposing substrate, which has semiconductors (semiconductor layer) having a photoconductive property that are formed virtually on its entire surface, are flatly connected with each other by conductive members each of which is independently formed for each of the pixels. In this construction, areas other than the area having each conductive member in the gap between the active-matrix substrate and the opposing substrate are filled with an insulating material.

Therefore, since the opposing substrate on which the semiconductors are formed and the active-matrix substrate are formed in a separate manner, even those semiconductor materials, which have not been directly formed on the active-matrix substrate as a film conventionally due to problems derived from the relationship between the film-forming temperature of the semiconductor and the heat resistance of the active-matrix substrate, may be utilized in the two-dimensional image detector.

Moreover, since the areas other than the area having each conductive member in the gap between the active-matrix substrate and the opposing substrate are filled with an insulating material, the conductive member is not exposed to outer air including moisture, etc. Therefore, it is possible to protect the conductive member from moisture and deterioration in the adhesive property and conductivity with time, and consequently to improve the reliability of the conductive member, that is, the reliability of the two-dimensional image detector. Furthermore, the application of the insulating material makes it possible to reduce electrical crosstalk occurring between the adjacent pixels through the conductive member.

Moreover, the application of an inactive gas (the inactive gas, mentioned here, includes gases having less reactive gas such as nitrogen, besides rare gases such as argon) prevents the conductive member from being exposed to outer air including moisture, etc., and keeps the conductive member always in contact with the inactive gas. Thus, it is possible to protect the conductive member from moisture and deterioration in the adhesive property and conductivity with time.

Furthermore, silicone oil may be used as the insulating material instead of the above-mentioned inactive gas. This arrangement prevents the conductive member from being exposed to outer air including moisture, etc., and keeps the conductive member always in contact with the silicone oil. Since the silicone oil is a chemically inactive liquid, it is possible to protect the conductive member from moisture and deterioration in the adhesive property and conductive property with time.

Moreover, a photopolymerizable high polymer may be used as the above-mentioned insulating material instead of the inactive gas and silicone oil. This arrangement prevents the conductive member from being exposed to outer air including moisture, etc., and keeps the conductive member always in contact with the photopolymerizable high polymer. Consequently, it becomes possible to protect the conductive member from moisture and deterioration in the adhesive property and conductive property with time.

Furthermore, the above-mentioned photopolymerizable high polymer has a superior adhesive property as is indicated by the fact that it is used as a ultraviolet setting adhesive agent. It is optimal if the conductive member itself also serves as an adhesive agent for bonding the active-matrix substrate and the opposing substrate; however, in the case of a poor adhesive property of the conductive member, the two substrates tend to easily separate from each other. Therefore, by injecting the photopolymerizable high polymer into areas other than the area having the conductive member in the gap between the active-matrix substrate and the opposing substrate, the photopolymerizable high polymer serves as an adhesive agent, thereby allowing the two substrates to be firmly bonded to each other and making it possible to improve the reliability of the mechanical strength of the two-dimensional image detector.

Moreover, the two-dimensional image detector of the present invention, which has an active-matrix substrate, which has lattice-shaped wiring (gate electrodes and source electrodes), a plurality of thin-film transistors (TFTs) installed at the respective lattice points of the electrode wiring and a plurality of pixel electrodes, and an opposing substrate, which has semiconductors (semiconductor layer) having a photoconductive property that are formed virtually on its entire surface, are flatly connected with each other by conductive members each of which is independently formed for each of the pixels, may be designed so that areas other the area having the conductive member are depressurized as compared with the atmospheric pressure.

Therefore, since the opposing substrate having the semiconductors and the active matrix substrate are formed in a separate manner, even those semiconductor materials, which conventionally have not been directly formed on the active-matrix substrate as a film due to problems derived from the relationship between the film-forming temperature of the semiconductor and the heat resistance of the active-matrix substrate, may be utilized in the two-dimensional image detector.

Since the areas other than the area having the conductive member in the gap between the active-matrix substrate and the opposing substrate are depressurized as compared with the atmospheric pressure, it is possible to completely shield the conductive member from the air. Therefore, the conductive member is not exposed to the outside air including moisture, etc. Thus, it is possible to protect the conductive member from moisture and deterioration in the adhesive property, the conductivity, etc. with time.

Here, it is optimal if the conductive member itself also serves as an adhesive agent for bonding the active-matrix substrate and the opposing substrate; however, in the case of a poor adhesive property of the conductive member, the two substrates tend to easily separate from each other. Therefore, by depressurizing the gap between the two substrates lower than the atmospheric pressure as described above, the atmospheric pressure is always applied on the outside of the two substrates in joining directions of the two substrates, thereby also making it possible to improve the reliability of the mechanical strength of the two-dimensional image detector.

Moreover, the two-dimensional image detector of the present invention, which has an active-matrix substrate, which has lattice-shaped wiring (gate electrodes and source electrodes), a plurality of thin-film transistors (TFTs) installed at the respective lattice points of the electrode wiring and a plurality of pixel electrodes, and an opposing substrate, which has semiconductors (semiconductor layer) having a photoconductive property that are formed virtually on its entire surface, are flatly connected with each other by conductive members each of which is independently formed for each of the pixels, is preferably designed so that the peripheral area of the joining area of the two substrates is sealed.

With the above-mentioned arrangement, since the peripheral area of the joining area of the two substrates is sealed as described above, the gap between the two substrates is not exposed to the outside air. Therefore, since the conductive member is, of course, not exposed to the outside air including moisture, etc., it is possible to protect the conductive member from moisture and deterioration in the adhesive property, the conductivity, etc. with time.

Moreover, in the case when the gap between the active-matrix substrate and the above-mentioned opposing substrate is filled with an insulating material such as an inactive gas, silicone oil or a photopolymerizable high polymer, the filling material can be easily sealed by sealing the peripheral area of the joining area of the two substrates areas.

Furthermore, in the case when the gap between the active-matrix substrate and the opposing substrate is depressurized lower than the atmospheric pressure, since the gap of the two substrates is tightly sealed, it is possible to easily carry out a depressurization.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detector comprising:
    an active-matrix substrate having a switching element and a charge-storage capacity including a pixel electrode connected to the switching element;
    an opposing substrate that is provided with an electrode layer and a semiconductor layer having a photoconductivity and that is aligned face to face with the active-matrix substrate with a gap in between;
    a conductive connecting member for connecting the pixel electrode and the semiconductor layer, that is placed in the gap between the active-matrix substrate and the opposing substrate; and
    a seal member for sealing a peripheral portion of a joining area between the active-matrix substrate and the opposing substrate.

2. The two-dimensional image detector as in claim 1, further comprising:
    an insulating material that is placed in the gap between the active-matrix substrate and the opposing substrate, at areas having no conductive connecting member.

3. The two-dimensional image detector as defined in claim 2, wherein said insulating material is an inactive gas.

4. The two-dimensional image detector as defined in claim 2, wherein said insulating material is an inactive liquid.

5. The two-dimensional image detector as defined in claim 3, wherein said inactive liquid is silicone oil.

6. The two-dimensional image detector as defined in claim 2, wherein said insulating material is a photopolymerizable high polymer.

7. A two-dimensional image detector as in claim 1,
    wherein an area having no conductive connecting member in the gap between the active-matrix substrate and the opposing substrate is depressurized to a reduced pressure lower than the atmospheric pressure.

8. The two-dimensional image detector as defined in claim 1, wherein said semiconductor layer is a compound semiconductor made of CdTe or CdZnTe.

9. The two-dimensional image detector as defined in claim 1, wherein said opposing substrate is provided with a charge-blocking layer for blocking a charge injection from one side, which is installed on the semiconductor layer.

10. The two-dimensional image detector as defined in claim 1, wherein said seal member has an opening section.

11. The two-dimensional image detector as defined in claim 1, wherein an insulating layer is installed between the electrode layer and the semiconductor layer.

12. The two-dimensional image detector as defined in claim 1, wherein said connecting material is a photosensitive resin having an adhesive property.

13. A two-dimensional detector as in claim 1 wherein the pixel electrode is connected to the switching element on the drain side.

14. A two-dimensional image detector comprising:
    an active-matrix substrate having a switching element and a charge-storage capacity including a pixel electrode connected to the switching element;
    an opposing substrate that is provided with an electrode layer and a semiconductor layer having a photoconductivity and that is aligned face to face with the active-matrix substrate with a gap in between;
    a conductive connecting member for connecting the pixel electrode and the semiconductor layer, that is placed in the gap between the active-matrix substrate and the opposing substrate;
    a seal member in a peripheral region between the active-matrix substrate and the opposing substrate, and said seal member sealing a gap between the active-matrix substrate and the opposing substrate, and
    an insulating material that is placed in the gap between the active-matrix substrate and the opposing substrate, said insulating material being within a perimeter of the seal member, and said insulating material being at areas having no conductive connecting member, and the insulating material fills an area having no conductive conducting member in the gap between the active-matrix substrate and the opposing substrate.

15. The two-dimensional image detector as in claim 14, wherein said insulating material is an inactive gas.

16. The two-dimensional image detector as in claim 14, wherein said insulating material is an inactive liquid.

17. The two-dimensional image detector as in claim 14, wherein said inactive liquid is silicone oil.

18. The two-dimensional image detector as in claim 14, wherein said insulating material is a photopolymerizable high polymer.

19. The two-dimensional detector as in claim 14 wherein the pixel electrode is connected to the switching element on the drain side.

20. The two-dimensional image detector as defined in claim 9, wherein said opposing substrate is provided with a connecting electrode placed at a position facing the pixel electrode of the active-matrix substrate, on the charge-blocking layer.

\* \* \* \* \*